(12) United States Patent
Mizuguchi et al.

(10) Patent No.: US 8,477,384 B2
(45) Date of Patent: Jul. 2, 2013

(54) SOLID-STATE IMAGE PICKUP DEVICE AND IMAGE PICKUP METHOD

(75) Inventors: Toshitaka Mizuguchi, Kawasaki (JP); Katsuyoshi Yamamoto, Kawasaki (JP); Jun Funakoshi, Kawasaki (JP); Tsuyoshi Higuchi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 653 days.

(21) Appl. No.: 12/211,613

(22) Filed: Sep. 16, 2008

(65) Prior Publication Data

US 2009/0009822 A1  Jan. 8, 2009

Related U.S. Application Data

(63) Continuation of application No. PCT/JP2006/305827, filed on Mar. 23, 2006.

(51) Int. Cl.
*H04N 1/40* (2006.01)

(52) U.S. Cl.
USPC .......................................................... 358/471

(58) Field of Classification Search
USPC .................. 358/2.99, 3.01, 3.03, 3.04, 3.05, 358/3.06, 3.1, 3.22, 3.26, 461, 463, 465, 358/466, 471, 474, 500, 501, 513, 516, 519, 358/529

See application file for complete search history.

(56) References Cited

U.S. PATENT DOCUMENTS

| | | | | |
|---|---|---|---|---|
| 4,291,243 A | * | 9/1981 | Hamilton et al. | 327/566 |
| 7,522,199 B2 | * | 4/2009 | Funakoshi et al. | 348/245 |
| 7,768,677 B2 | * | 8/2010 | Kawai | 358/482 |
| 2003/0202111 A1 | * | 10/2003 | Park | 348/243 |
| 2006/0001753 A1 | * | 1/2006 | Funakoshi et al. | 348/308 |
| 2006/0007507 A1 | * | 1/2006 | Inaba et al. | 358/474 |

FOREIGN PATENT DOCUMENTS

| | | |
|---|---|---|
| JP | 09-083836 | 3/1997 |
| JP | 2000-184294 | 6/2000 |
| JP | 2000-184924 | 6/2000 |
| JP | 2005-101985 | 4/2005 |
| JP | 2005-328135 | 11/2005 |

* cited by examiner

*Primary Examiner* — Marivelisse Santiago Cordero
*Assistant Examiner* — John Wallace
(74) *Attorney, Agent, or Firm* — Fujitsu Patent Center

(57) ABSTRACT

A solid-state image pickup device and image pickup method eliminate a dark-current component by adjusting the black level appropriately even if the dark-current component varies among horizontal lines. A pixel array includes light-receiving pixel elements and light-blocking pixel elements disposed such that horizontal lines include the light-blocking pixel elements individually. A readout circuit block reads pixel signals of each of the horizontal lines from the pixel array, inputs the pixel signals to ADC circuits (column ADC circuit block), and outputs the pixel signals of the light-blocking pixel elements. A ramp signal generation circuit obtains the pixel signals of the light-blocking pixel elements output from the readout circuit block, generates a ramp signal by using a reference level of AD conversion adjusted for each of the horizontal lines in accordance with the obtained pixel signals of the light-blocking pixel elements, and inputs the ramp signal to the ADC circuits.

8 Claims, 10 Drawing Sheets

SOLID-STATE IMAGE PICKUP DEVICE AND IMAGE PICKUP METHOD

This application is a continuing application, filed under 35 U.S.C. section 111(a), of International Application PCT/JP2006/305827, filed Mar. 23, 2006.

BACKGROUND

1. Field

The present embodiment relates to solid-state image pickup devices and image pickup methods, and particularly to a solid-state image pickup device using an analog-to-digital converter disposed for each column in a pixel array and an image pickup method using the solid-state image pickup device.

2. Description of the Related Art

There are known solid-state image pickup devices, such as complementary metal-oxide semiconductor (CMOS) image sensors, that incorporate so-called column ADC circuits, that is, analog-to-digital converter circuits disposed for individual columns of a pixel array.

FIG. 8 is a diagram showing the structure of a conventional solid-state image pickup device 500 incorporating column ADC circuits.

The conventional solid-state image pickup device 500 includes a pixel array 501, a readout circuit block 502, a column ADC circuit block 503, a latch/serial-parallel conversion circuit 504, a digital-to-analog converter (DAC) circuit 505, a comparator 506, a timing generation circuit 507, and a ramp signal generation circuit 508.

The pixel array 501 includes a light-receiving pixel area 501a including a plurality of light-receiving pixel elements (not shown) disposed in a matrix manner and a light-blocking pixel area 501b including a plurality of light-blocking pixel elements (not shown). A pixel signal read from a light-blocking pixel element is used to eliminate an offset owing to a dark current component, from a pixel signal of a light-receiving pixel element. The light-blocking pixel area 501b is disposed to surround the light-receiving pixel area 501a, for instance.

The readout circuit block 502 reads pixel signals of each read line (horizontal line) from the pixel array 501. The readout circuit block 502 includes a column amplifier circuit block 502a for amplifying the read pixel signals and a column correlated double sampling (CDS) circuit block 502b for reducing noise. The column amplifier circuit block 502a includes amplifier circuits disposed for individual columns. The column CDS circuit block 502b includes CDS circuits disposed for individual columns.

The column ADC circuit block 503 includes ADC circuits disposed for individual columns and converts analog pixel signals read by the readout circuit block 502 to digital values.

The latch/serial-parallel conversion circuit 504 latches the digital values of the pixel signals obtained by the column ADC circuit block 503, performs serial-to-parallel conversion, and outputs parallel data.

The DAC circuit 505 performs digital-to-analog conversion of a pixel signal read from a light-blocking pixel element, of the pixel signals output from the latch/serial-parallel conversion circuit 504, and obtains a voltage value (black level).

The comparator 506 compares the black level output from the DAC circuit 505 and a reference voltage VREF, which is an ideal black level of the readout circuit block 502 and the column ADC circuit block 503, and adjusts, in accordance with the difference therebetween, a reference voltage VREFa to be supplied to the readout circuit block 502.

The timing generation circuit 507 generates timing signals and gives the signals to the readout circuit block 502, the column ADC circuit block 503, the latch/serial-parallel conversion circuit 504, the DAC circuit 505, and the ramp signal generation circuit 508.

The ramp signal generation circuit 508 includes an amplifier circuit 5081, a constant-current power supply 5082, a switch S10, and a capacitor C10. The amplifier circuit 5081 has one input terminal to receive the reference voltage VREF and the other input terminal connected to its output terminal, and functions as a buffer. The output terminal of the amplifier circuit 5081 is connected through the switch S10 to one terminal of the capacitor C10 and one terminal of the constant-current power supply 5082. The other terminals of the capacitor C10 and the constant-current power supply 5082 are grounded.

In the ramp signal generation circuit 508, when the switch S10 is turned on by a timing signal sent from the timing generation circuit 507, the capacitor C10 retains the reference voltage VREF. When the switch S10 is turned off later, a ramp waveform increasing at a constant ratio with reference to the reference voltage VREF is output from the one terminal of the constant-current power supply 5082 and input to the column ADC circuit block 503.

FIG. 9 is a diagram showing the structure of a conventional column CDS circuit.

The figure shows a column CDS circuit 510 disposed for a single column, in the column CDS circuit block 502b.

The column CDS circuit 510 includes amplifier circuits 511 and 512, switches S11 and S12, and capacitors C11 and C12. The amplifier circuit 511 has one input terminal to receive a pixel signal output from the column amplifier circuit block 502a through the switch S11. The capacitor C11 has one terminal connected between the switch S11 and the input terminal of the amplifier circuit 511 and another terminal grounded. The amplifier circuit 511 has another input terminal connected to its output terminal and functions as a buffer.

The amplifier circuit 512 has one input terminal connected through the capacitor C12 to the output terminal of the amplifier circuit 511. The reference voltage VREFa is applied through the switch S12 between the capacitor C12 and the input terminal of the amplifier circuit 512. The amplifier circuit 512 has another input terminal connected to its output terminal and functions as a buffer. The output terminal of the amplifier circuit 512 is connected to the column ADC circuit block 503.

In the column CDS circuit 510, described above, when the switches S11 and S12 are turned on by timing signals from the timing generation circuit 507, the capacitor C12 retains a reset signal (noise) read at a reset of a pixel element (photodiode), as a voltage value with reference to the reference voltage VREFa. When the timing signal turns off the switch S12, the signal charge accumulated in accordance with the integral time (exposure time) is retained in the capacitor C11 through the column amplifier circuit block 502a, as the pixel signal. By subtracting the voltage value retained in the capacitor C12 from the pixel signal, which includes a noise component, the noise component is eliminated from the pixel signal. Then, the amplifier circuit 512 outputs the sum of the noise-eliminated pixel signal and the reference voltage VREFa.

FIG. 10 shows pixel signals and ranges of AD conversion in a read operation in the conventional solid-state image pickup device.

The figure shows pixel signals read from pixel elements in consecutive horizontal lines H1 and H2 of the pixel array 501 shown in FIG. 8. The upper chart shows pixel signals input to the readout circuit block 502, and the lower chart shows pixel signals input to the column ADC circuit block 503.

In the readout period for the horizontal line H1, pixel signals are input to the readout circuit block 502, when viewed from the left of the line in FIG. 8, from the light-blocking pixel area 501b, from the light-receiving pixel area 501a, and from the light-blocking pixel area 501b again. The pixel signals from these areas are input simultaneously in parallel, in accordance with a timing signal. After a blanking (BK) period, pixel signals of the next horizontal line H2 are input to the readout circuit block 502 in the same manner.

The pixel signals amplified and noise-eliminated by the readout circuit block 502 is input to the column ADC circuit block 503 (lower chart in FIG. 10). The pixel signals of the horizontal line H1 input to the column ADC circuit block 503 are subjected to analog-to-digital conversion based on the ramp signal with reference to the reference voltage VREF, latched by the latch/serial-parallel conversion circuit 504, and output as parallel data. In this process, pixel signals from the light-blocking pixel area 501b are converted to analog voltage values (black levels) by the DAC circuit 505 and compared with the reference voltage VREF by the comparator 506. In the example shown in FIG. 10, the average black level Vba1 of the horizontal line H1 is lower than the reference voltage VREF. The comparator 506 accordingly inputs a reference voltage VREFa2 obtained by adding the offset of the horizontal line H1 to the reference voltage VREFa1, to the readout circuit block 502.

As has been described above, the conventional solid-state image pickup device 500 tries to eliminate the dark current component by adjusting the black level through the adjustment of the reference voltage VREFa of the readout circuit block 502 by using the pixel signals of the light-blocking pixel elements after AD conversion (Japanese Unexamined Patent Publication No. 2005-101985).

However, the dark current component varies among horizontal lines. A difference between the offset of the immediately-preceding horizontal line and the offset of the pixel signal of the currently read horizontal line makes it impossible to adjust the black level completely.

In the example shown in FIG. 10, for example, although the average black level Vba2 of the pixel signals of the horizontal line H2 input to the readout circuit block 502 equals the reference voltage VREF, the black level is adjusted in accordance with the offset of the horizontal line H1. This generates an offset in the horizontal line H2, producing horizontal stripes in the output image.

The remaining offset reduces the number of quantization levels of actual data accordingly in AD conversion, as shown in FIG. 10, lowering the resolution, and the lowered resolution results in degraded image quality.

SUMMARY

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments will next be described in detail with reference to the drawings.

Figure 1:
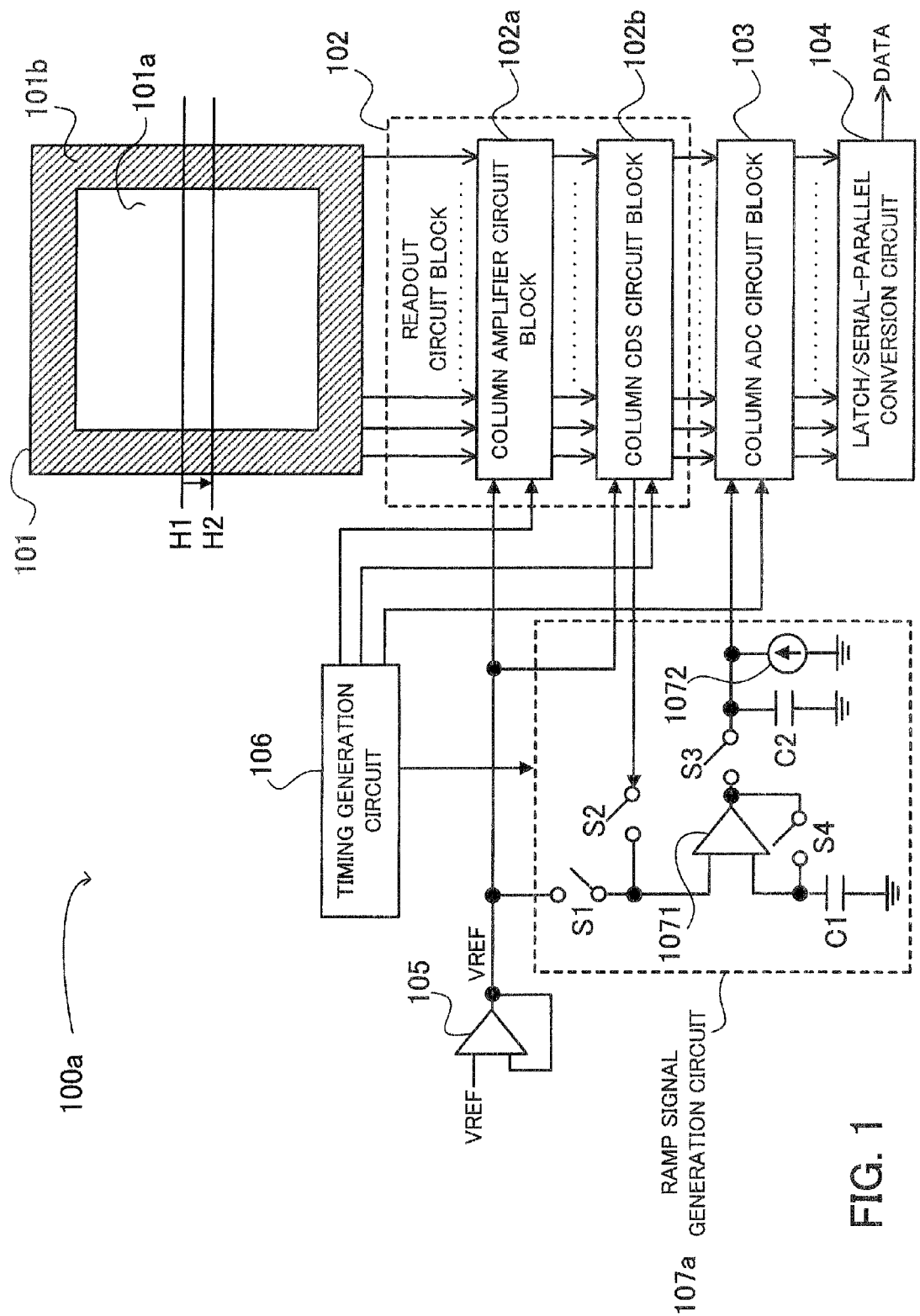
FIG. 1 is a diagram showing the structure of a solid-state image pickup device of a first embodiment.

FIG. 1 is a diagram showing the structure of a solid-state image pickup device 100a of a first embodiment.

The solid-state image pickup device 100a of the first embodiment includes a pixel array 101, a readout circuit block 102, a column ADC circuit block 103, a latch/serial-parallel conversion circuit 104, an amplifier circuit 105, a timing generation circuit 106, and a ramp signal generation circuit 107a.

The pixel array 101 includes a light-receiving pixel area 101a where a plurality of light-receiving pixel elements (not shown) are disposed in a matrix manner, and a light-blocking pixel area 101b where a plurality of light-blocking pixel elements (not shown) are disposed. Pixel signals read from the light-blocking pixel elements are used to eliminate an offset caused by a dark current component, from pixel signals of the light-receiving pixel elements. The light-blocking pixel area 101b is disposed to surround the light-receiving pixel area 101a, for example, in such a manner that each horizontal line includes light-blocking pixel elements.

The readout circuit block 102 reads pixel signals of each horizontal line from the pixel array 101. The readout circuit block 102 includes a column amplifier circuit block 102a for amplifying the read pixel signals and a column CDS circuit block 102b for eliminating noise. The column amplifier circuit block 102a includes amplifier circuits disposed for individual columns. The column CDS circuit block 102b includes CDS circuits disposed for individual columns. Each amplifier circuit of the column amplifier circuit block 102a is connected to a column signal line (not shown). The circuit inputs a pixel signal from a pixel element selected out of the pixel elements connected to the column signal line, and amplifies the signal. The column CDS circuit block 102b will be described later in detail.

The column ADC circuit block 103 includes ADC circuits disposed for individual columns and converts pixel signals read by the readout circuit block 102 to digital values.

The latch/serial-parallel conversion circuit 104 latches the digital values of the pixel signals obtained by the column ADC circuit block 103, performs serial-to-parallel conversion, and outputs parallel data.

The amplifier circuit 105 has one input terminal to receive a reference voltage VREF and another input terminal connected to its output terminal, and functions as a buffer. With the output terminal connected to the column amplifier circuit block 102a and the column CDS circuit block 102b of the readout circuit block 102 and to the ramp signal generation circuit 107a, the amplifier circuit supplies the reference voltage VREF to them.

The timing generation circuit 106 generates timing signals and inputs the signals to the readout circuit block 102, the column ADC circuit block 103, the latch/serial-parallel conversion circuit 104, and the ramp signal generation circuit 107a.

The ramp signal generation circuit 107a includes an amplifier circuit 1071, a constant-current power supply 1072, switches S1, S2, S3, S4, and capacitors C1, C2. One input terminal of the amplifier circuit 1071 is connected through the switch S1 to the output terminal of the amplifier circuit 105 and through the switch S2 to the column CDS circuit block 102b. Another input terminal of the amplifier circuit 1071 is connected to its output terminal through the switch S4 and to one terminal of the capacitor C1. The other terminal of the capacitor C1 is grounded. The output terminal of the amplifier circuit 1071 is connected through the switch S3 to one terminal of the capacitor C2 and one terminal of the constant-current power supply 1072. The other terminals of the capacitor C2 and the constant-current power supply 1072 are grounded.

Figure 2:
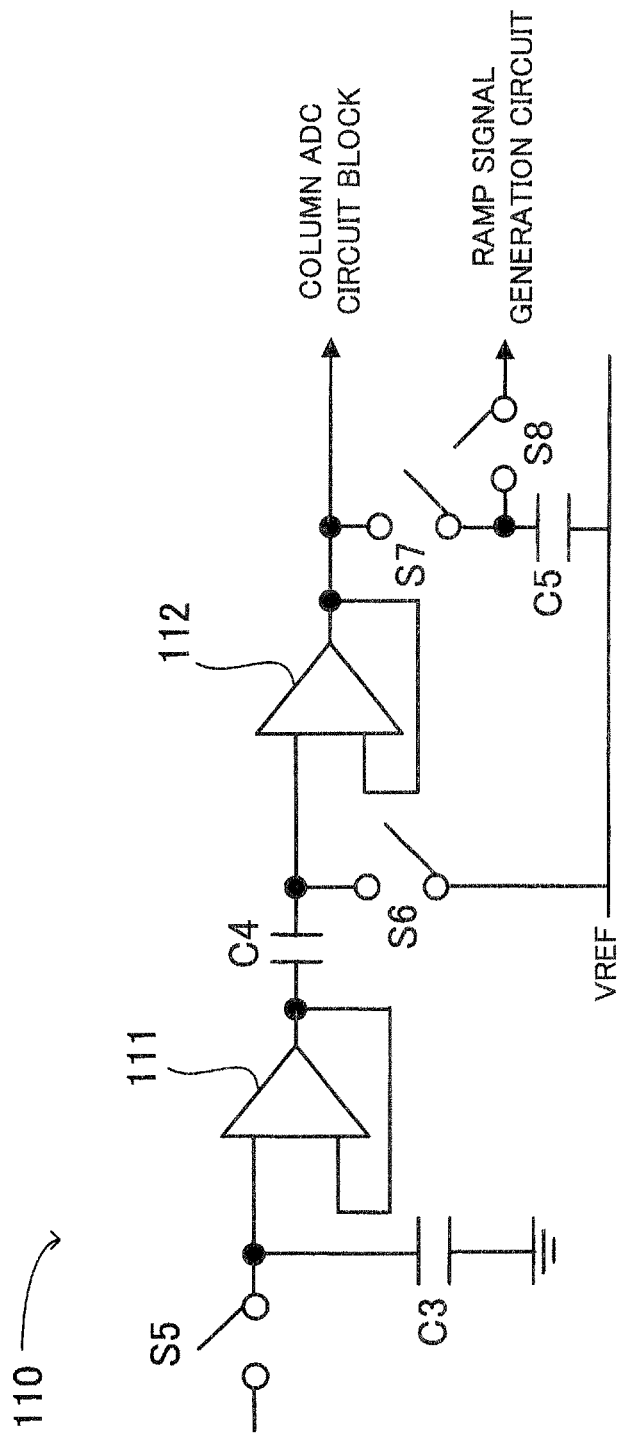
FIG. 2 is a diagram showing the structure of a column CDS circuit.

FIG. 2 is a diagram showing the structure of each of the column CDS circuits.

The figure shows a column CDS circuit 110 disposed for one column, in the column CDS circuit block 102b.

The column CDS circuit 110 includes amplifier circuits 111 and 112, switches S5, S6, S7, and S8, and capacitors C3, C4, and C5. The amplifier circuit 111 has one input terminal to receive a pixel signal output from the column amplifier circuit block 102a through the switch S5. The capacitor C3 has one terminal connected between the switch S5 and the input terminal of the amplifier circuit 111 and another terminal grounded. The amplifier circuit 111 connects the other input terminal to its output terminal and functions as a buffer.

The output terminal of the amplifier circuit 111 is connected through the capacitor C4 to one input terminal of the amplifier circuit 112. Between the capacitor C4 and the input terminal of the amplifier circuit 112, the reference voltage VREF is applied through the switch S6. The amplifier circuit 112 has the other input terminal connected to its output terminal and functions as a buffer. The output terminal of the amplifier circuit 112 is connected to the column ADC circuit block 103. The output terminal of the amplifier circuit 112 is also connected through the switch S7 to one terminal of the capacitor C5. To the other terminal of the capacitor C5, the reference voltage VREF is applied. To a node between the switch S7 and the capacitor C5, the ramp signal generation circuit 107a is connected through the switch S8.

The operation of the solid-state image pickup device 100a of the first embodiment will be described next.

The readout circuit block 102 reads pixel signals of each horizontal line from the pixel array 101 shown in FIG. 1 by scanning it from top to bottom, for instance.

Figure 3:
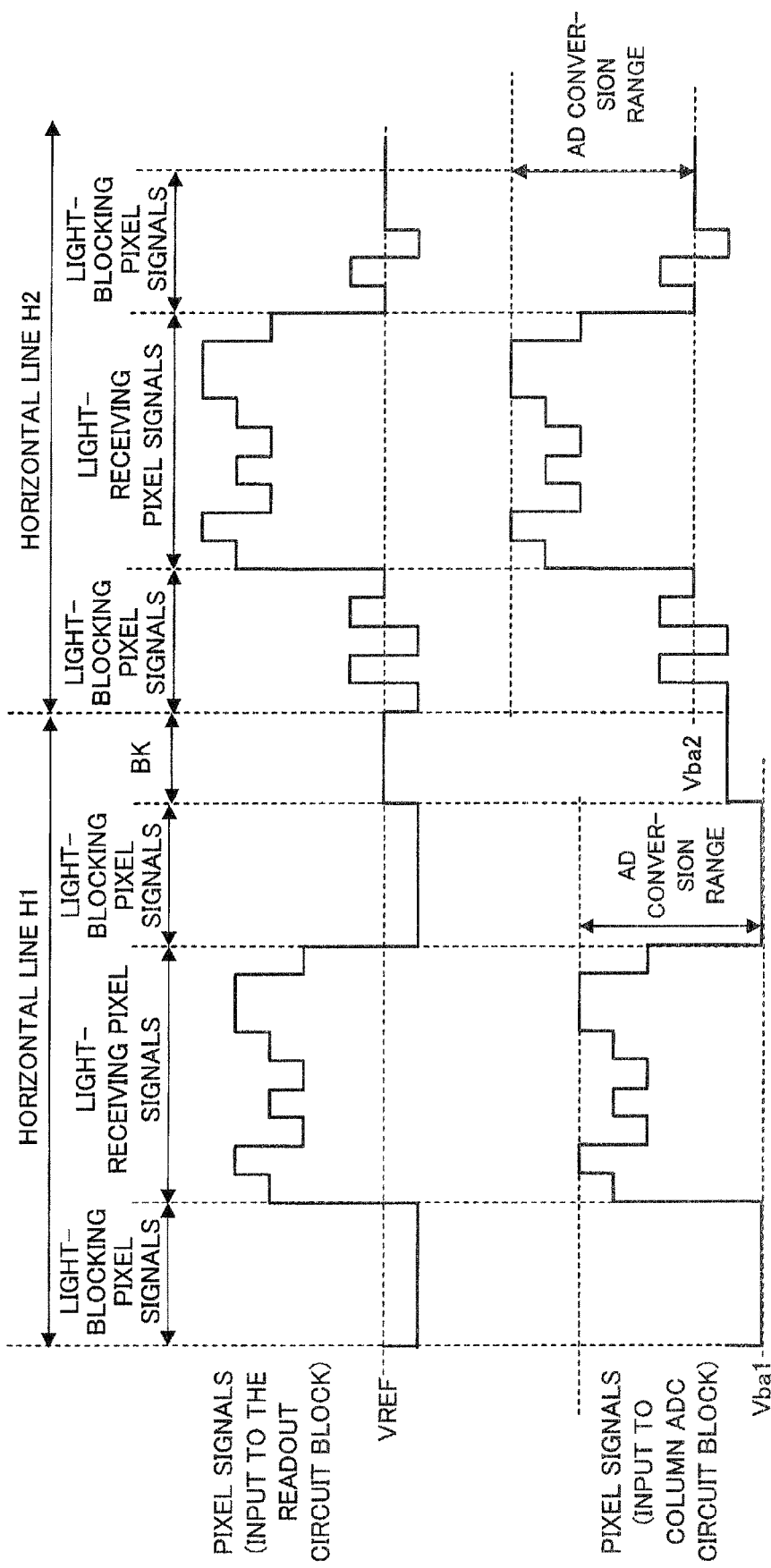
FIG. 3 is a diagram showing pixel signals and ranges of AD conversion in a read operation in the solid-state image pickup device of the first embodiment.

FIG. 3 is a diagram showing pixel signals and ranges of AD conversion in a read operation in the solid-state image pickup device 100a of the first embodiment.

The figure shows pixel signals read from pixel elements in consecutive horizontal lines H1 and H2 in the pixel array 101 shown in FIG. 1. The upper chart shows pixel signals input to the readout circuit block 102, and the lower chart shows pixel signals input to the column ADC circuit block 103.

In the readout period for the horizontal line H1, pixel signals are input to the readout circuit block 102, when viewed from the left of the line in FIG. 1, from the light-blocking pixel area 101b, from the light-receiving pixel area 101a, and from the light-blocking pixel area 101b again. The pixel signals from the areas are input simultaneously in parallel in accordance with the timing signal.

The input pixel signals are amplified by the column amplifier circuit block 102a, and then input to the column CDS circuit block 102b, where the column CDS circuit 110 structured as shown in FIG. 2 is disposed for each column. In this process, the column CDS circuits 110 of the column CDS circuit block 102b and the ramp signal generation circuit 107a perform the following operation in accordance with the timing signals sent from the timing generation circuit 106.

Figure 4:
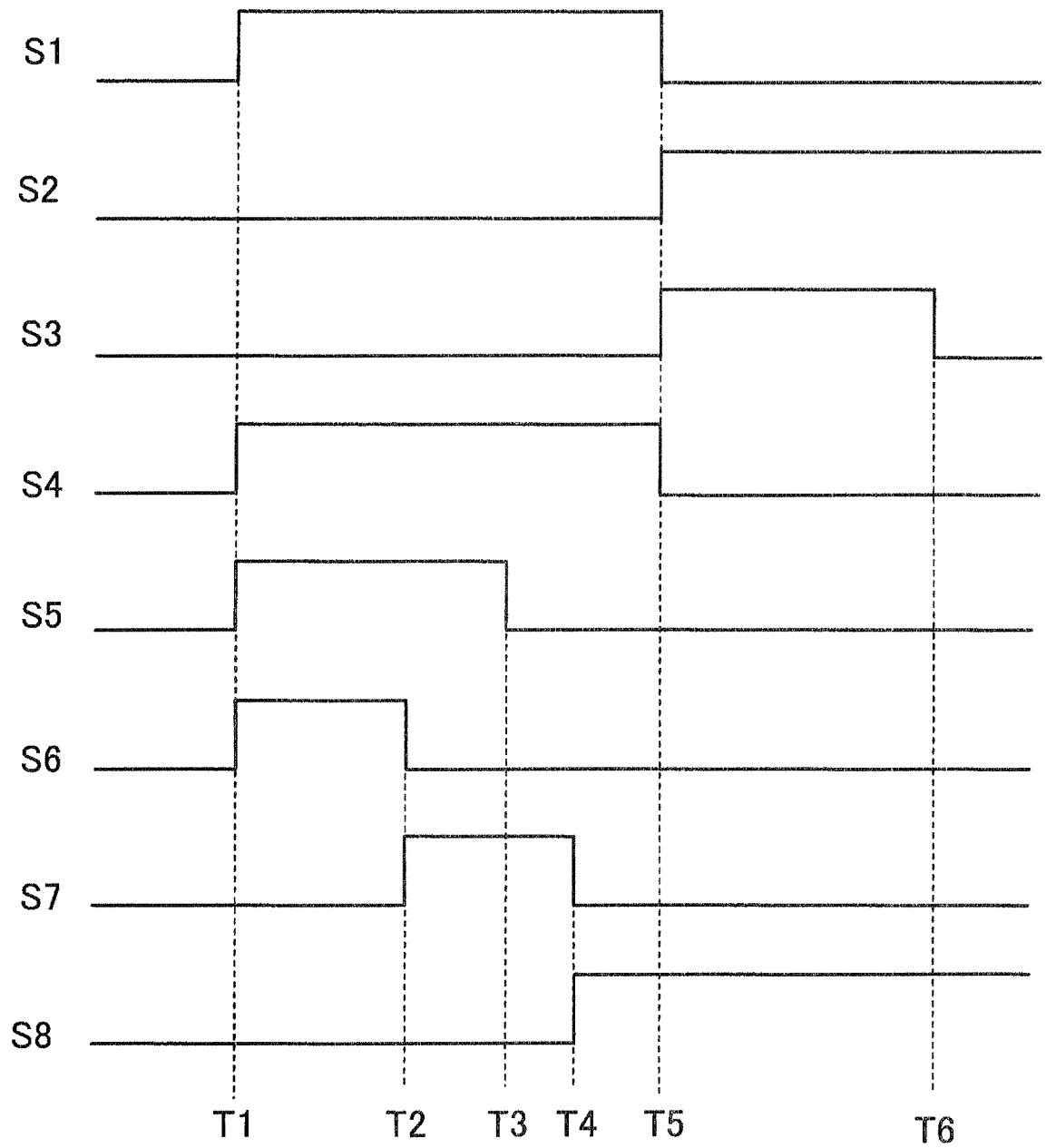
FIG. 4 is a timing chart showing an example of operation of switches in the solid-state image pickup device of the first embodiment.

FIG. 4 is a timing chart showing an example of operation of switches in the solid-state image pickup device 100a of the first embodiment.

At time T1, the switches S1 and S4 of the ramp signal generation circuit 107a and the switches S5 and S6 of the column CDS circuit 110 are turned on. At this time, the capacitor C4 of the column CDS circuit 110 holds a reset signal (noise) to be read at a reset of a pixel element (photodiode), as a voltage value with reference to the reference voltage VREF. When the switch S6 is turned off next (at time T2) by a timing signal, the signal charge accumulated in accordance with the integral time (exposure time) is retained in the capacitor C3 through the column amplifier circuit block 102a, as a pixel signal. The voltage value retained in the capacitor C4 is subtracted from the pixel signal, to eliminate the noise component. The amplifier circuit 112 outputs the sum of the noise-eliminated pixel signal and the reference voltage VREF to the column ADC circuit block 103.

At this time, in the column CDS circuit 110 connected to a column signal line of the light-blocking pixel area 101b, the switch S7 is turned on by a timing signal. This causes the sum of the noise-eliminated pixel signal of the light-blocking pixel element and the reference voltage VREF to be accumulated in the capacitor C5. In the column CDS circuit 110 connected to a column signal line of the light-receiving pixel area 101a, the switch S7 is not turned on.

After the switch S5 in the column CDS circuit 110 is turned off by a timing signal (time T3), the switch S7 is turned off and the switch S8 is turned on at the same time (time T4). This causes the sum of the pixel signal of the light blocking pixel element and the reference voltage VREF to be output from the capacitor C5 to the ramp signal generation circuit 107a. At time t4, in the ramp signal generation circuit 107a, the switches S1 and S4 are on, and the switches S2 and S3 are off. Therefore, the sum of the reference voltage VREF and the offset voltage of the amplifier 1071 is accumulated in the capacitor C1.

Next, by a timing signal, the switches S1 and S4 are turned off, and the switches S2 and S3 are turned on (time T5). At this time, the ramp signal generation circuit 107a obtains the sum of the reference voltage VREF and the pixel signal of the light-blocking pixel element from the capacitor C5 of each of a plurality of column CDS circuits 110 connected to the column signal lines of the light-blocking pixel area 101b. The levels (black levels) of the pixel signals of light-blocking pixel elements obtained from the plurality of column CDS circuits 110 are averaged out. The amplifier circuit 1071 compares the voltage retained in the capacitor C1 (the sum of the reference voltage VREF and the offset voltage of the amplifier circuit 1071) with the sum of the average black level (hereinafter called an average black level Vba1) and the reference voltage VREF. The offset component of the amplifier circuit 1071 is eliminated, and the difference, which is the average black level Vba1, is retained in the capacitor C2. This sets the reference level of the ramp signal to the average black level Vba1 of the pixel signals of light-blocking pixel elements of the horizontal line H1. When the switch S3 is turned off at time T6, the constant-current power supply 1072 generates a ramp waveform increasing at a constant rate from the adjusted reference level and supplies it to the column ADC circuit block 103.

By the operation described above, the column ADC circuit block 103 performs AD conversion with reference to the average black level Vba1 of the light-blocking pixel elements of the horizontal line H1, as shown in the lower chart of FIG. 3.

Then, after a blanking (BK) period, pixel signals of the next horizontal line H2 are input to the readout circuit block 102 in the same manner. In this process, the switches S1 to S8 in the column CDS circuit block 102b and the ramp signal generation circuit 107a are turned on or off at the timing shown in FIG. 4. This causes the average black level Vba2 of the light-blocking pixel elements in the horizontal line H2 to be accumulated in the capacitor C2. When the switch S3 is turned off, the constant-current power supply 1072 generates a ramp waveform based on the average black level Vba2 and inputs it to the column ADC circuit block 103.

By this operation, the column ADC circuit block 103 performs AD conversion with reference to the average black level Vba2 of the light-blocking pixel elements of the horizontal line H2, as shown in the lower chart of FIG. 3.

As described above, the solid-state image pickup device 100a of the first embodiment does not adjust the black level by using the pixel signals of the light-blocking pixel elements in a horizontal line immediately preceding the read line but adjusts the reference level of AD conversion by using the pixel signals of the light-blocking pixel elements in the read horizontal line. Accordingly, even if the dark current component varies among horizontal lines, the black level can be adjusted appropriately, and therefore the dark current component can be eliminated. This will prevent horizontal stripes from being produced in the image. Because reliable AD conversion of actual data can be performed, the image quality will not be lowered by a reduced resolution.

A solid-state image pickup device 100b of a second embodiment will be described next.

Figure 5:
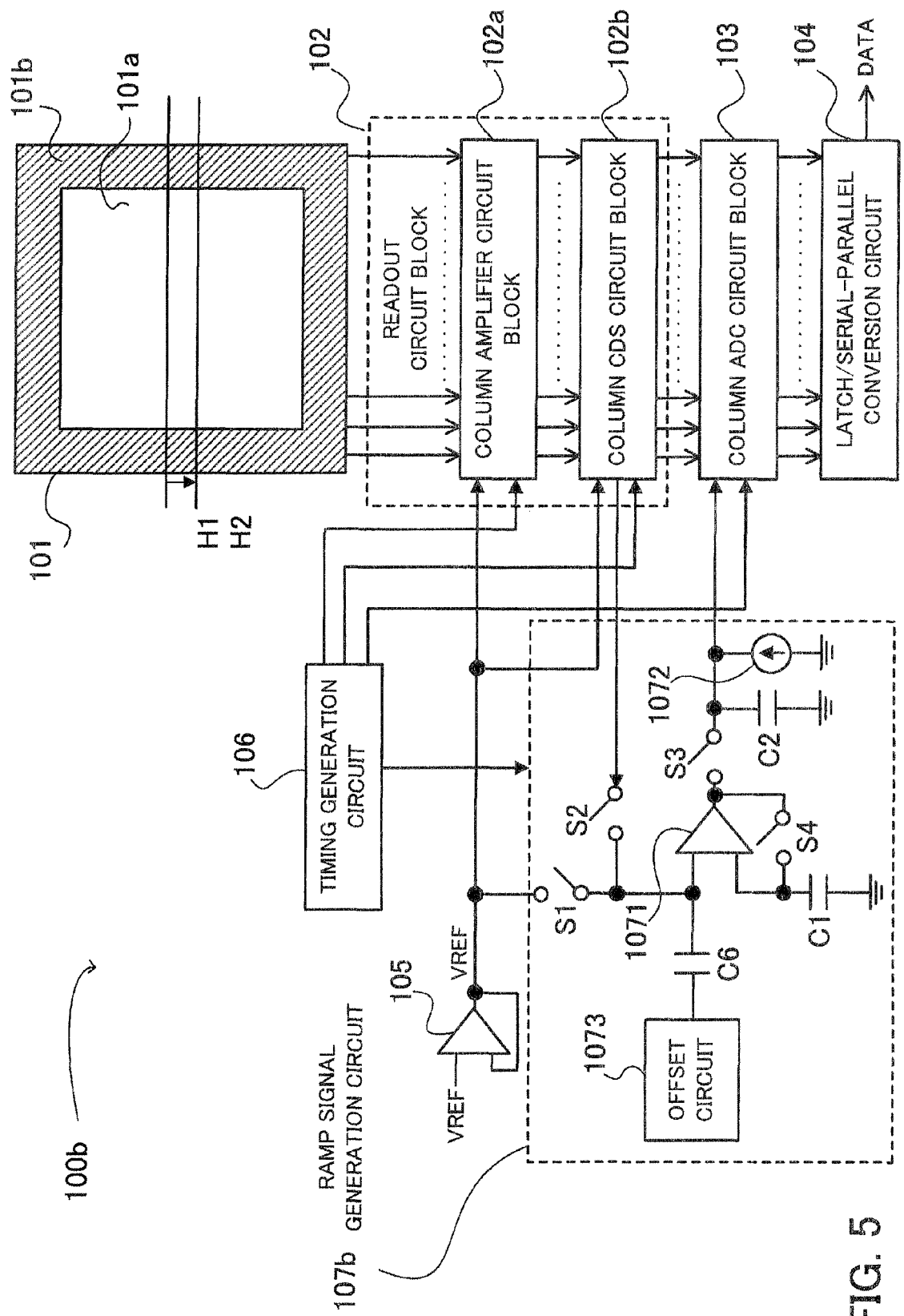
FIG. 5 is a diagram showing the structure of a solid-state image pickup device of a second embodiment.

FIG. 5 is a diagram showing the structure of the solid-state image pickup device 100b of the second embodiment.

Elements identical to those in the solid-state image pickup device 100a of the first embodiment will be denoted by the same reference symbols, and a description of those elements will be omitted.

The solid-state image pickup device 100b of the second embodiment differs from the solid-state image pickup device 100a of the first embodiment in that an offset circuit 1073 is connected via a capacitor C6 to one input terminal of an amplifier circuit 1071 in a ramp signal generation circuit 107b. The offset circuit 1073 generates a predetermined offset voltage ΔVoff.

In the solid-state image pickup device 100b of the second embodiment, when switches S and S4 are off and switches S2 and S3 are on, the ramp signal generation circuit 107b obtains the sum of a reference voltage VREF and the pixel signals of light-blocking pixel elements from a column CDS circuit block 102b. At this time, the capacitor C6 retains the difference (Vba+VREF−Δvoff) obtained by subtracting the offset voltage ΔVoff generated by the offset circuit 1073 from the sum of the reference voltage VREF and an average black level Vba of the pixel signals of the light-blocking pixel elements. Then, the switch S2 is turned off. In this process, the sum of the reference voltage VREF and the offset voltage of an amplifier circuit 1071 is accumulated in a capacitor C1. The amplifier circuit 1071 compares the value of voltage accumulated in the capacitor C1 and the value of voltage accumulated in the capacitor C6. The offset voltage of the amplifier circuit 1071 is cancelled; a capacitor C2 retains the difference (Vba−ΔVoff) between the average black level Vba and the offset voltage ΔVoff; and this voltage becomes the reference level of AD conversion.

Figure 6:
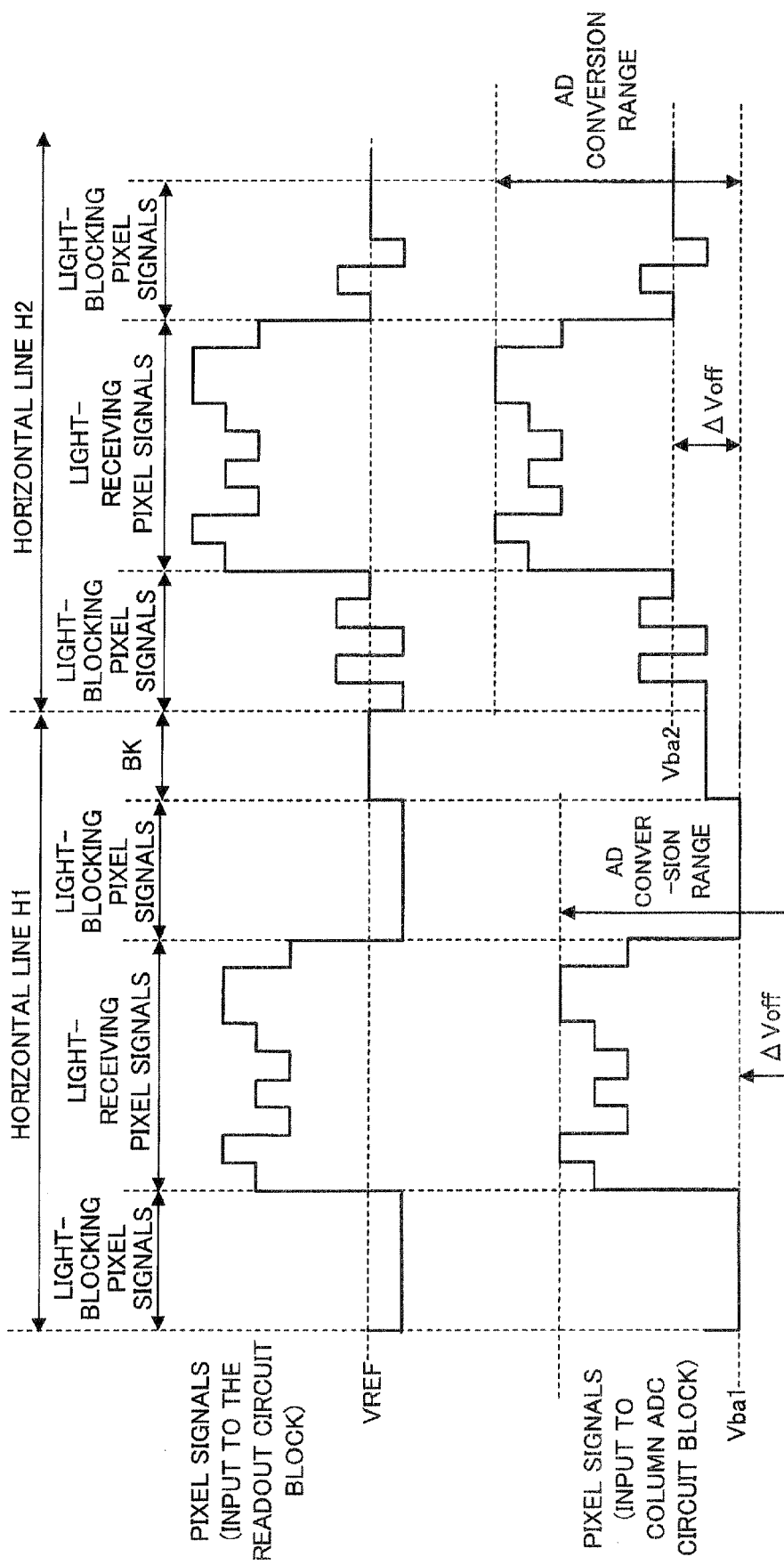
FIG. 6 is a diagram showing pixel signals and ranges of AD conversion in a read operation in the solid-state image pickup device of the second embodiment.

FIG. 6 is a diagram showing pixel signals and ranges of AD conversion in a read operation in the solid-state image pickup device 100b of the second embodiment.

The figure shows pixel signals read from pixel elements in consecutive horizontal lines H1 and H2 in a pixel array 101 shown in FIG. 6. The upper chart shows pixel signals input to a readout circuit block 102, and the lower chart shows pixel signals input to a column ADC circuit block 103 and ranges of AD conversion.

The solid-state image pickup device 100b of the second embodiment uses voltages obtained by shifting the average black levels Vba1 and Vba2 of the pixel signals of the light-blocking pixel elements by the offset voltage ΔVoff, as the reference levels of AD conversion for the horizontal lines H1 and H2, respectively.

The offset voltage ΔVoff can be changed by the offset circuit 1073, so that the black level can be adjusted for each horizontal line, allowing the brightness to be adjusted.

In the pixel array 101 shown in FIG. 1 and FIG. 5, the light-blocking pixel area 101b is disposed to surround the light-receiving pixel area 101a, but the structure is not thus limited and may be as described below.

Figure 7:
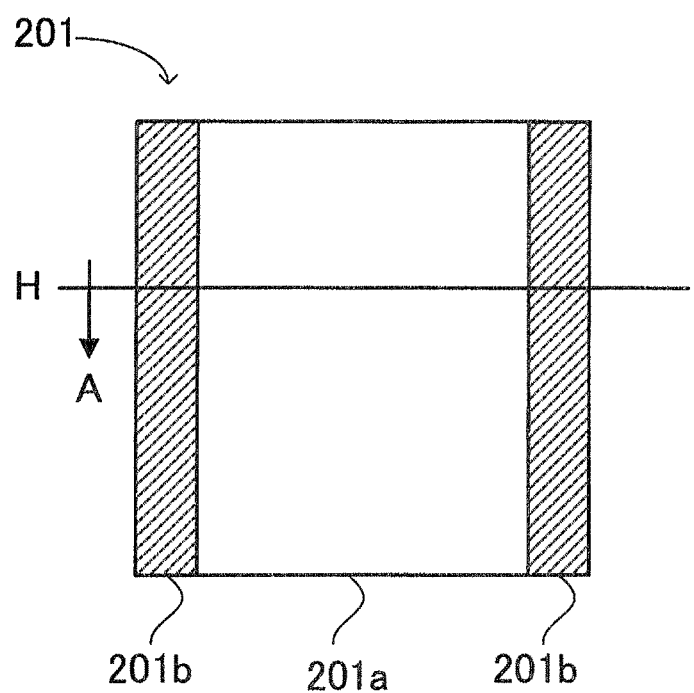
FIG. 7 shows another example pixel array.
Figure 8:
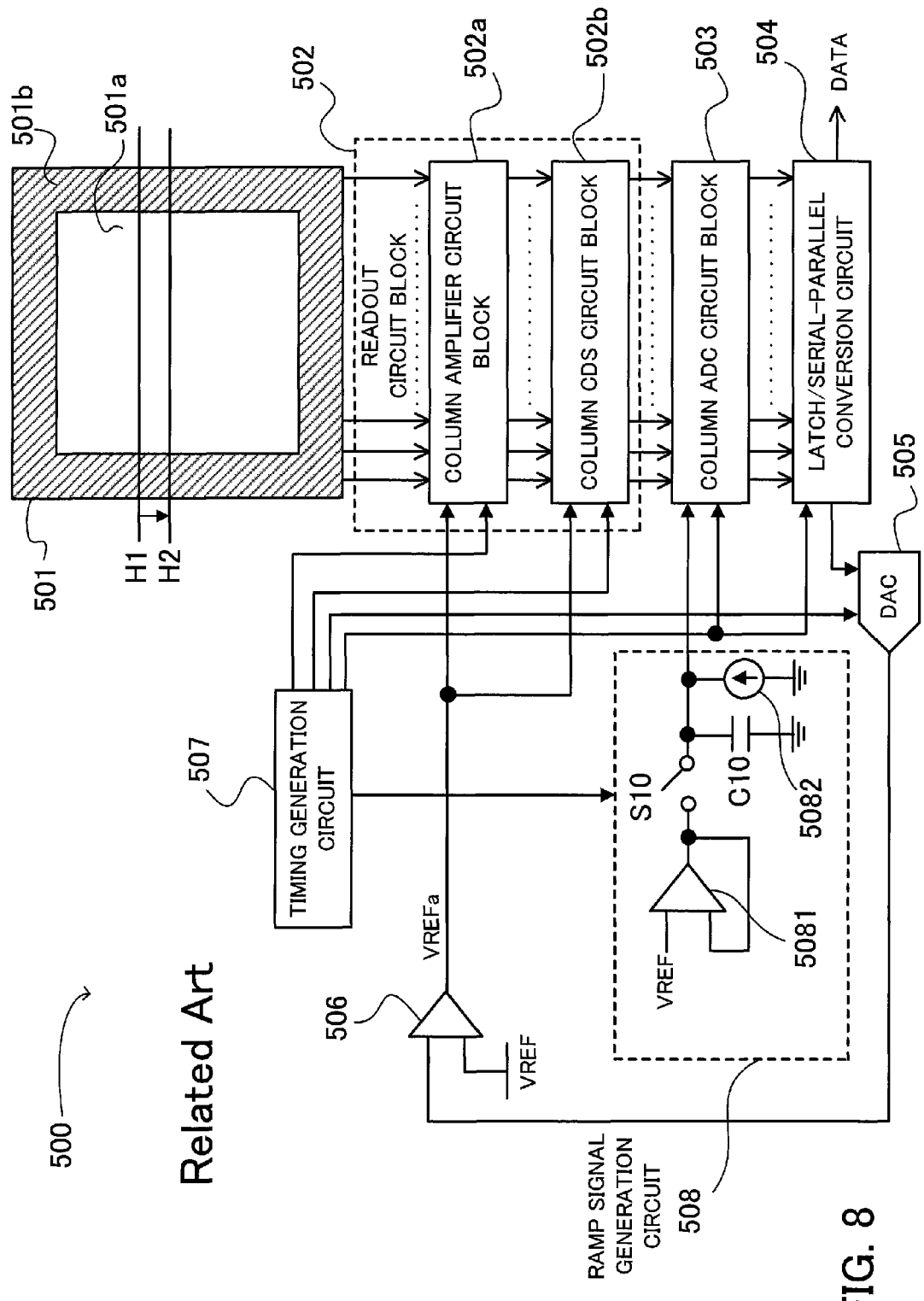
FIG. 8 is a diagram showing the structure of a conventional solid-state image pickup device incorporating a column ADC circuit.
Figure 9:
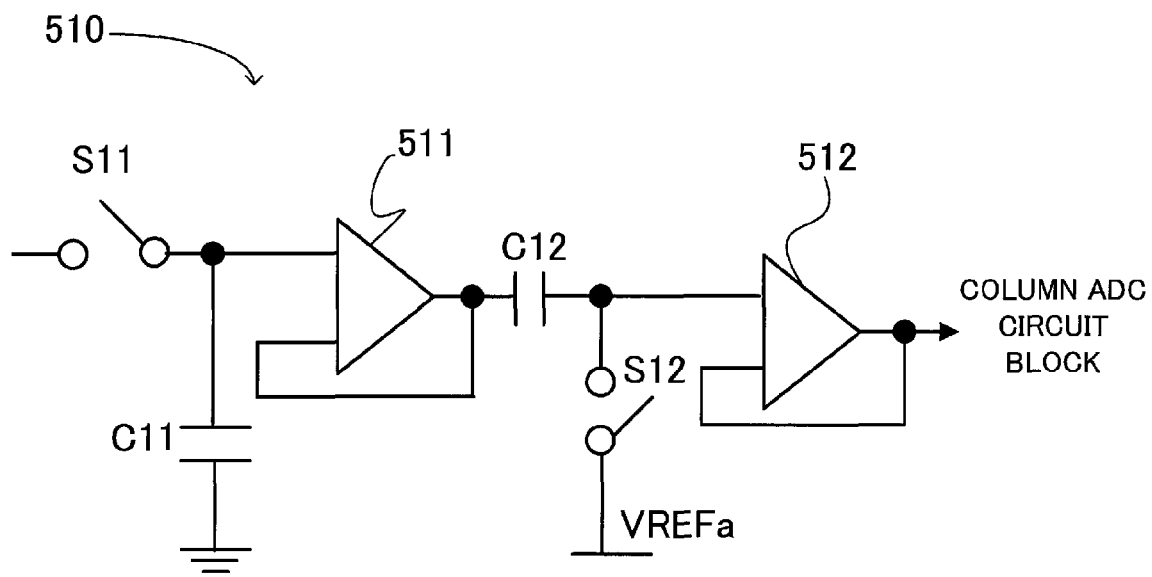
FIG. 9 is a diagram showing the structure of a conventional column CDS circuit.
Figure 10:
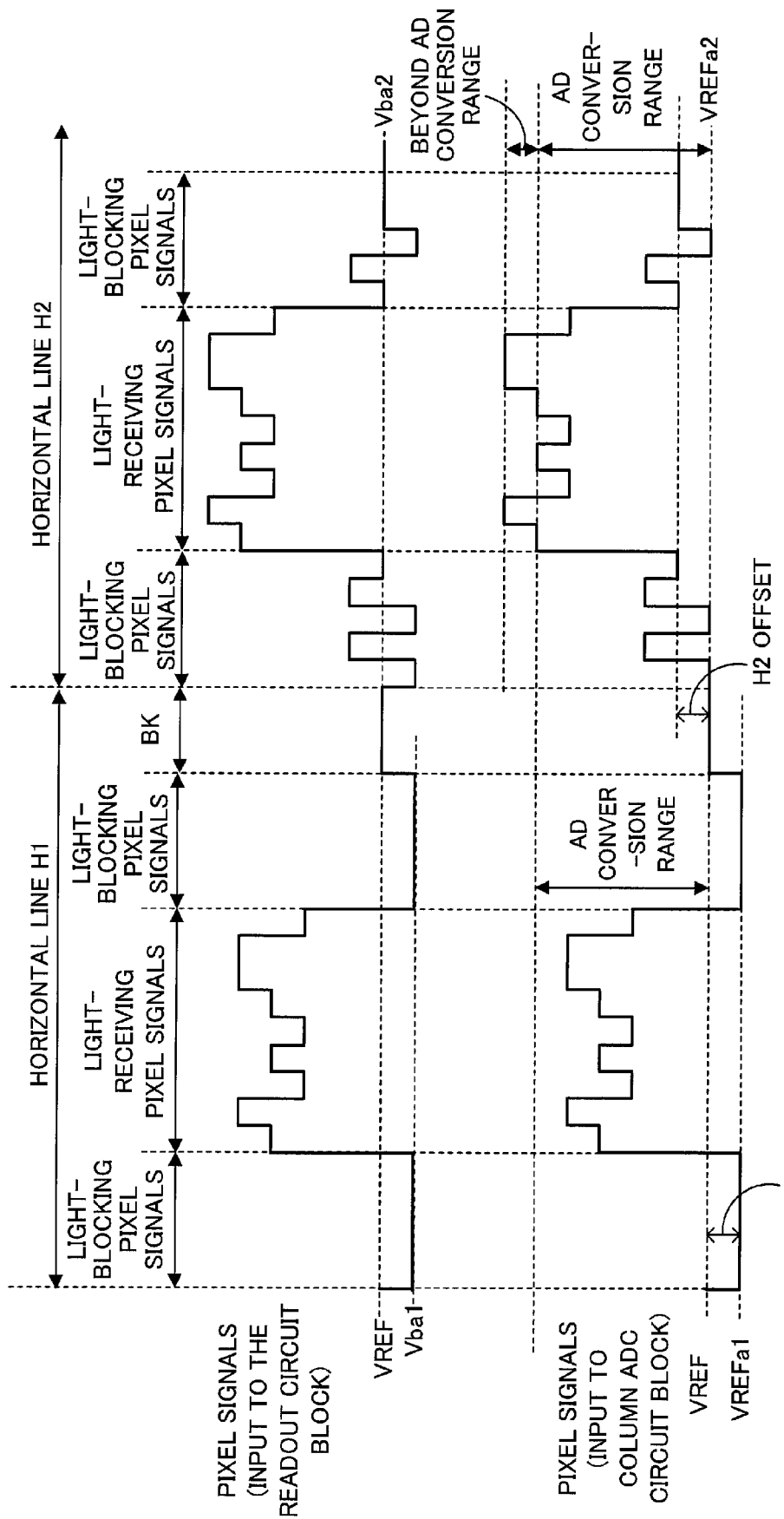
FIG. 10 is a diagram showing pixel signals and ranges of AD conversion in a read operation in the conventional solid-state image pickup device.

FIG. 7 shows another example pixel array.

A pixel array 201 has light-blocking pixel areas 201b disposed to the left and right of a light-receiving pixel area 201a with reference to a scanning direction A for horizontal lines H. In this structure, the column CDS circuit block 102b as shown in FIG. 1 or FIG. 5 inputs the average value of the pixel signals of a plurality of light-blocking pixel elements in the right and left light-blocking pixel areas 201b to the ramp signal generation circuit 107a or 107b. The ramp signal generation circuit 107a or 107b adjusts the reference level of the ramp signal in accordance with the average value. The average value of the pixel signals of the light-blocking pixel elements of one of the light-blocking pixel areas 201b, either right one or left one, may be input to the ramp signal generation circuit 107a or 107b.

The light-blocking pixel areas 201b may not be disposed on both sides, right and left, and may be disposed on either side, right or left, and the average value of the pixel signals of the light-blocking pixel elements in the light-blocking pixel areas 201b may be input to the ramp signal generation circuit 107a or 107b.

According to the present invention, when pixel signals are read from pixel elements in a horizontal line, the reference level of the ramp signal used for AD conversion of the pixel signals of the horizontal line is adjusted in accordance with the pixel signals of light-blocking pixel elements included in the horizontal line, so that the black level is adjusted appropriately even if the dark current component varies among horizontal lines. This allows the dark current component to be eliminated without lowering the resolution in AD conversion.

Because the resolution does not decrease even if the dark current component varies with temperature, the image quality will not be degraded.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A solid-state image pickup device comprising:
   a pixel array in which light-receiving pixel elements and light-blocking pixel elements are disposed such that reading lines include the light-blocking pixel elements individually;
   analog-to-digital converters disposed for columns of the pixel array individually;
   a readout circuit block for reading pixel signals of each of the reading lines from the pixel array, inputting the pixel signals to the analog-to-digital converters, and outputting the pixel signals of the light-blocking pixel elements; and
   a ramp signal generation circuit for obtaining an average value of the pixel signals of the light-blocking pixel elements output from the readout circuit block, adjusting a reference level of analog-to-digital conversion for each of the reading lines, in accordance with the average value of the pixel signals of the light-blocking pixel elements included in each of the reading lines, generating a ramp signal which increases at a constant rate from the reference level, and inputting the ramp signal to the analog-to-digital converters.

2. The solid-state image pickup device according to claim 1, wherein the readout circuit block comprises CDS circuits disposed for the columns of the pixel array individually; and
   the CDS circuits output noise-eliminated pixel signals of the light-blocking pixel elements to the ramp signal generation circuit.

3. The solid-state image pickup device according to claim 2, wherein the CDS circuits comprise capacitors, individually, for retaining the noise-eliminated pixel signals of the light-blocking pixel elements; and
   the ramp signal generation circuit obtains an averaged pixel signal of the light-blocking pixel elements from the capacitors of the CDS circuits.

4. The solid-state image pickup device according to claim 1, wherein light-blocking pixel areas comprising the light-blocking pixel elements are disposed to the right and left of a light-receiving pixel area comprising the light-receiving pixel elements, with reference to a scanning direction for the reading lines; and
   the readout circuit block outputs the pixel signals of the light-blocking pixel elements of either or both of the right and left light-blocking pixel areas; and
   the ramp signal generation circuit obtains the average value of the pixel signals of the light-blocking pixel elements and adjusts the reference level in accordance with the average value.

5. The solid-state image pickup device according to claim 1, wherein a light-blocking pixel area comprising the light-blocking pixel elements is disposed to the right or left of a light-receiving pixel area comprising the light-receiving pixel elements, with reference to a scanning direction for the reading lines; and
   the readout circuit block outputs the pixel signals of the light-blocking pixel elements of the light-blocking pixel areas; and
   the ramp signal generation circuit obtains the average value of the pixel signals of the light-blocking pixel elements and adjusts the reference level in accordance with the average value.

6. The solid-state image pickup device according to claim 1, wherein the ramp signal generation circuit comprises an offset circuit for adjusting the reference level by adding an offset voltage to the pixel signals of the light-blocking pixel elements.

7. An image pickup method for a solid-state image pickup device comprising a readout circuit block for reading pixel signals from a pixel array and inputting the pixel signals to analog-to-digital converters, the image pickup method comprising:
   reading the pixel signals of each of reading lines from the pixel array in which light-receiving pixel elements and light-blocking pixel elements are disposed such that the reading lines include the light-blocking pixel elements individually;
   inputting the pixel signals to the analog-to-digital converters disposed for columns of the pixel array individually;
   obtaining an average value of the pixel signals of the light-blocking pixel elements output from the readout circuit block;
   adjusting a reference level of analog-to-digital conversion for each of the reading lines, in accordance with the average value of the pixel signals of the light-blocking pixel elements included in each of the reading lines;
   generating a ramp signal which increases at a constant rate from the reference level; and
   inputting the ramp signal to the analog-to-digital converters.

8. The image pickup method according to claim 7, wherein the reference level is adjusted by adding an offset voltage to the pixel signals of the light-blocking pixel elements.

* * * * *